United States Patent
Park et al.

(10) Patent No.: US 8,143,096 B2
(45) Date of Patent: Mar. 27, 2012

(54) INTEGRATED CIRCUIT PACKAGE SYSTEM FLIP CHIP

(75) Inventors: SooMoon Park, Jinju-si (KR); KyungHoon Lee, Icheon (KR)

(73) Assignee: STATS ChipPAC Ltd., Singapore (SG)

( * ) Notice: Subject to any disclaimer, the term of this patent is extended or adjusted under 35 U.S.C. 154(b) by 125 days.

(21) Appl. No.: 12/194,507

(22) Filed: Aug. 19, 2008

(65) Prior Publication Data

US 2010/0044882 A1 Feb. 25, 2010

(51) Int. Cl.
*H01L 23/24* (2006.01)

(52) U.S. Cl. ............ 438/107; 257/737; 257/E21.499; 257/E23.141

(58) Field of Classification Search .......... 257/778–784, 257/786, 736–737, E23.141, E21.499; 438/106–109
See application file for complete search history.

(56) References Cited

U.S. PATENT DOCUMENTS

| | | | |
|---|---|---|---|
| 5,647,123 A | 7/1997 | Greenwood et al. | |
| 5,705,858 A * | 1/1998 | Tsukamoto | 257/778 |
| 6,610,559 B2 | 8/2003 | Wang et al. | |
| 6,960,518 B1 | 11/2005 | Tsao et al. | |
| 7,183,139 B2 | 2/2007 | Jayaraman et al. | |
| 7,339,276 B2 | 3/2008 | Manepalli et al. | |
| 7,901,997 B2 * | 3/2011 | Ozawa et al. | 438/125 |
| 2004/0159945 A1 | 8/2004 | Shi et al. | |
| 2006/0060636 A1 | 3/2006 | Daves et al. | |
| 2007/0200234 A1 | 8/2007 | Gerber et al. | |
| 2008/0012148 A1 * | 1/2008 | Takahashi | 257/778 |

* cited by examiner

*Primary Examiner* — Hoa B Trinh
(74) *Attorney, Agent, or Firm* — Mikio Ishimaru

(57) ABSTRACT

An integrated circuit package system includes: providing a substrate having a top side with a trace conductor connected to a bottom side with a system interconnect; forming a bump ring on the substrate, the bump ring having an inner cavity area over the trace conductor and an outer bump area; applying a substrate mask layer adjacent a perimeter of the outer bump area; connecting a device to the trace conductor below the bump ring; and applying a compound between the device and the substrate.

20 Claims, 5 Drawing Sheets

INTEGRATED CIRCUIT PACKAGE SYSTEM FLIP CHIP

TECHNICAL FIELD

The present invention relates generally to integrated circuit packages and more particularly to flip chip integrated circuit package systems.

BACKGROUND ART

The integrated circuit package is the building block used in a high performance electronic system to provide applications for usage in products such as robotics equipment, gps devices, advanced cell phone devices, medical electronic devices, and a vast line of other similar products that require small compact electronics supporting many complex functions.

The traditional integrated circuit package typically consists of a package base or package substrate providing a mounting structure for attachment of at least one chip or die and an enclosure such as an epoxy applied on it to protect its contents. Typically, one side of the chip or the die is used primarily for the mounting the chip or die. The other side of the chip or the die, referred to as an active surface of the chip or the die, has electrically conductive areas that provide for electrical connections to its circuitry.

High performance compact devices requiring small dimensions of length, width, and thickness are highly sought after in the competitive world markets. Design and development of the chip or the die having small length, width, and thickness as well as high performance functionality and reliability are increasingly growing in demand. A sought after package solution prevalent to meeting these requirements and offering additional benefits is called a flip chip.

The flip chip consists of the chip or the die having its active surface connected onto a substrate using connectors consisting of electrically conductive material. The side opposite the active surface of the flip chip is without protection such as an enclosure or epoxy and thus its surface is exposed. The flip chip, not having an enclosure, provides a lower height than the traditional integrated circuit packages resulting in the extremely thinner devices.

The flip chip provides improvements in manufacturing and reliability over the traditional integrated circuit packages due to the fewer assembly steps and processes such as connections, wire routing, packaging lead placement, package lead formation, and error prone handling during assembly. Circuitry of the flip chip can be optimized for performance due to the shorter distances between the circuitry and the substrate over traditional integrated circuit packages.

Since the flip chip is not enclosed, it is crucial to prevent possible problems due to heat. Heat generated by the flip chip can cause temporary or permanent failure of the circuitry within the flip chip. Heat generated by the flip chip can cause mechanical failure such as loss of connections to the substrate. Heat generated by the flip chip can cause structural failure such as cracking or warping of the chip or the die.

A key to solving heat related issues of the flip chip is the application of a compound material such as a thermally conductive epoxy to the areas subjected to the most heat related stress. The compound material is applied between the active surface of the flip chip and the substrate. The compound fills gaps between and around the connectors and fills areas between the flip chip and the substrate. The compound material is often cured, effectively cementing the flip chip, the connectors between the flip chip, and the substrate together as a single integrated circuit package.

The compound material can only be effective if sufficient amounts can be applied into the gap areas between the flip chip and the substrate. The gap height or gap distance is the distance between the active surface of the flip chip and the substrate surface connected to the flip chip. The larger the gap height, the more compound material can be applied into the gap areas resulting in improved avoidance of heat related problems.

Typical industry solutions to increase gap height involve the use of larger connectors to raise the flip chip higher away from the substrate. This compromises key objectives and advantages, such as cost, simplicity, and height dimensions of the resulting integrated circuit package. Other alternative solutions to increase the gap height involve specially designed substrates involving complex fabrication processing, costs, or substrates resulting in structural integrity related issues.

Attempts have failed to provide a complete solution addressing high performance compact integrated circuit packages having small thin profiles, high reliability, low cost and simplified manufacturing processing.

In view of the ever-increasing commercial competitive pressures, along with growing consumer expectations and the diminishing opportunities for meaningful product differentiation in the marketplace, it is critical that answers be found for these problems.

Solutions to these problems have been long sought but prior developments have not taught or suggested any solutions and, thus, solutions to these problems have long eluded those skilled in the art.

DISCLOSURE OF THE INVENTION

The present invention includes: providing a substrate having a top side with a trace conductor connected to a bottom side with a system interconnect; forming a bump ring on the substrate, the bump ring having an inner cavity area over the trace conductor and an outer bump area; applying a substrate mask layer adjacent a perimeter of the outer bump area; connecting a device to the trace conductor below the bump ring; and applying a compound between the device and the substrate.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
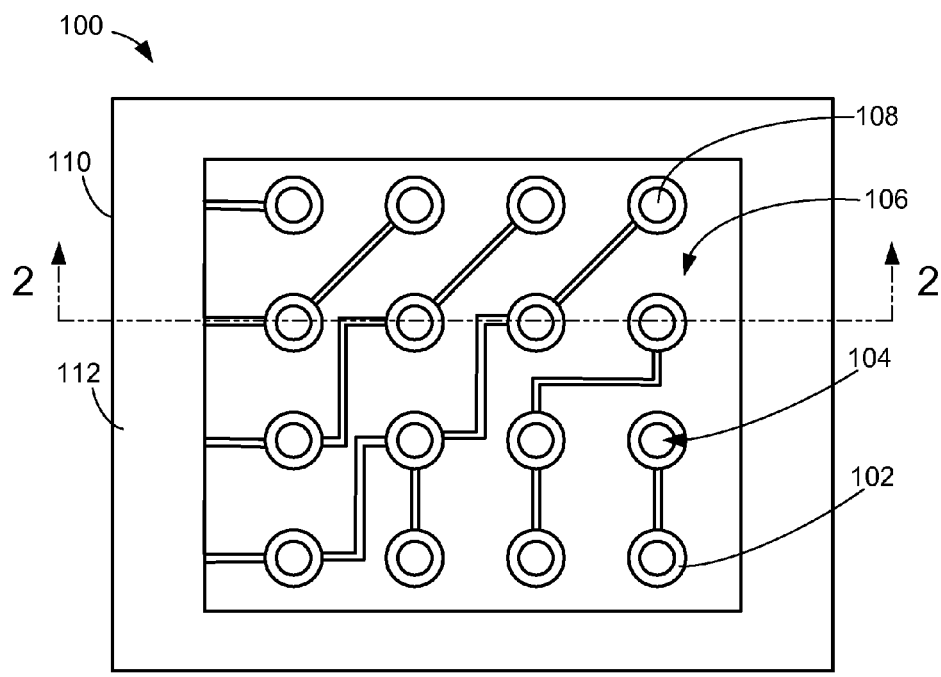
FIG. 1 is a top view of an integrated circuit package system in a first embodiment of the present invention in a build phase.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Referring now to FIG. 1, therein is shown a top view of an integrated circuit package system 100 in a first embodiment of the present invention in a build phase. The integrated circuit package system 100 can preferably include a bump ring 102, an inner cavity area 104, an outer bump area 106, device interconnects 108, a substrate 110, and a substrate mask layer 112.

The bump ring 102 can be distributed in a rectangular array configuration on the top side of the substrate 110 positioned over areas on the substrate 110 and the bump ring 102 can provide a single isolated electrical connectivity point. The locations of the bump ring 102 are not limited in distribution arrangement and can have any configuration on the top side of the substrate 110 including a random distribution.

The bump ring 102 can preferably be formed having a ring shaped structure and can be composed of non-conductive material such as a solder mask or other material having similar properties. The bump ring 102 forms the inner cavity area 104 and the outer bump area 106. The inner cavity area 104 can include the device interconnects 108 such as a solder ball. Each of the device interconnects 108 can individually reside within the inner cavity area 104 of the bump ring 104 to provide connectivity between the substrate 110 and a next level component.

The height and thickness of the bump ring 102 can be pre-determined based on the structural support needs of the user application, manufacturability, or physical attributes of the device interconnects 108 and material of the bump ring 102. The diameter of the inner cavity area 104 can be pre-determined based on the physical attributes such as quantity, pitch, or size of the device interconnects 108.

The shape of the bump ring 102 is not limited and can be formed having other dimensional shapes provided the inner cavity area 104 meets all of the manufacturability and application requirements associated with the device interconnects 108 selected for the integrated package system 100. The outer bump area 106 formed by the bump ring 102 is not covered with the substrate mask layer 112.

The substrate mask layer 112 can be applied on the top side of the substrate 110 from the perimeter of the outer bump area 106 formed by the bump ring 102 extending outward to each edge of the substrate 110. The substrate mask layer 112 can be composed of a non-conductive material such as a solder mask or a material having similar properties.

Figure 2:
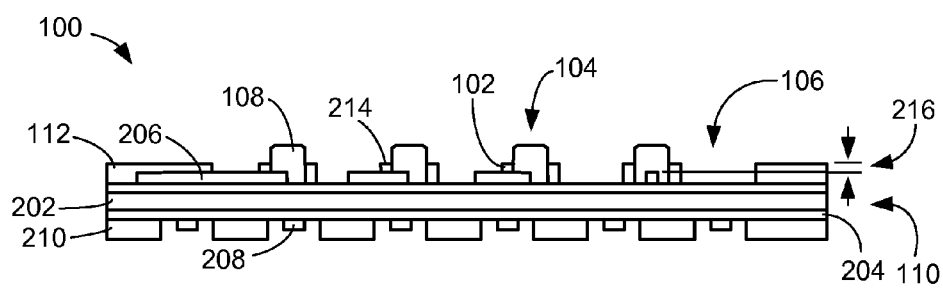
FIG. 2 is the cross-sectional view of FIG. 1 taken along the lines of 2-2.

Referring now to FIG. 2, therein is shown the cross-sectional view of FIG. 1 taken along the lines of 2-2. The substrate 110 consists of a substrate core 202 with the top side and the bottom side covered with a prepreg layer 204 such as impregnated laminates. Trace conductors 206 on the topside of the substrate 110 and inside the substrate core 202 can connect each of the device interconnects 108 with base contacts 208 such as solder pads exposed on the bottom side of the substrate 110.

A base mask layer 210 such as a solder mask or a material having similar properties can be applied to the bottom side of the substrate 110 to separate the base contacts 208 from one another. The trace conductors 206 exposed through the inner cavity area 104 located below a bump ring edge 214 can provide connectivity to the substrate 110.

The device interconnects 108 attached on the trace conductors 206 and substantially exposed above the heights of the bump ring 102 on the top side of the substrate 110 can provide connectivity between the device interconnects 108 and the base contacts 208 on the bottom side of the substrate 110.

Any of the trace conductors 206 or the prepreg layer 204 located outside a perimeter formed by the outer bump area 106 can be covered by the substrate mask layer 112. The substrate mask layer 112 can typically have a thickness of twenty micrometer resulting in an increase of at least ten micrometer in an additional gap height 216 due to the absence of the substrate mask layer 112 adjacent the outer bump area 106.

Figure 3:
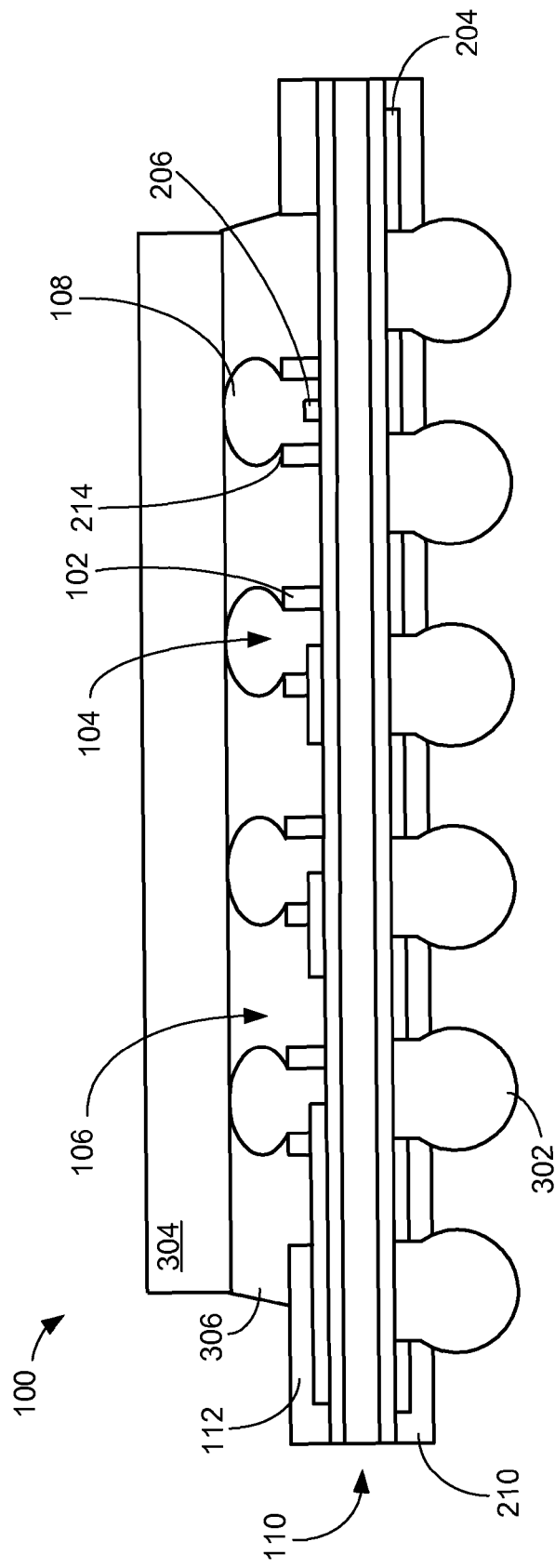
FIG. 3 is a cross-sectional view of FIG. 2 of the integrated circuit package system of the present invention.

Referring now to FIG. 3, therein is shown a cross-sectional view of FIG. 2 of the integrated circuit package system 100 of the present invention. System interconnects 302 can be attached to the base contacts 208 of FIG. 2 protruding above the prepreg layer 204 on the bottom side of the substrate 110 to provide connectivity between the substrate 110 and a next level system such as a printed circuit board.

The system interconnects 302 can be formed adjacent the base mask layer 210. The device interconnects 108 attached to the trace conductors 206 within the inner cavity area 104 located below the bump ring edge 214 can be connected to a device 304 such as a flip chip, interposer, or modular unit having circuitry. The device interconnects 108 can provide connectivity between the circuitry of the device 304, the trace conductors 206 of the substrate 110, and the system interconnects 302.

A compound 306 such as an underfill can be applied below the device 304 to fill areas between the device 304 and the substrate 110 surrounding the outer bump area 106 formed by the bump ring 102 on the top side of the substrate 110. The compound 306 substantially surrounds and conformally encloses the bump ring 102, each of the device interconnects 108, and can also fill areas between the device 304 and portions of the substrate mask layer 112 on the top side of the substrate 404.

The compound 306 minimizes any thermal strain to the device interconnects 108 due to any differences between the coefficients of thermal expansion of the device 304 and of the substrate 110.

It has been unexpectedly discovered that the additional gap height 216 of FIG. 2 can eliminate requiring the compound 306 to have small filler particle size or tightened particle size distribution tolerances resulting in lower manufacturing costs and minimization of low-density voids within the compound 306.

Figure 4:
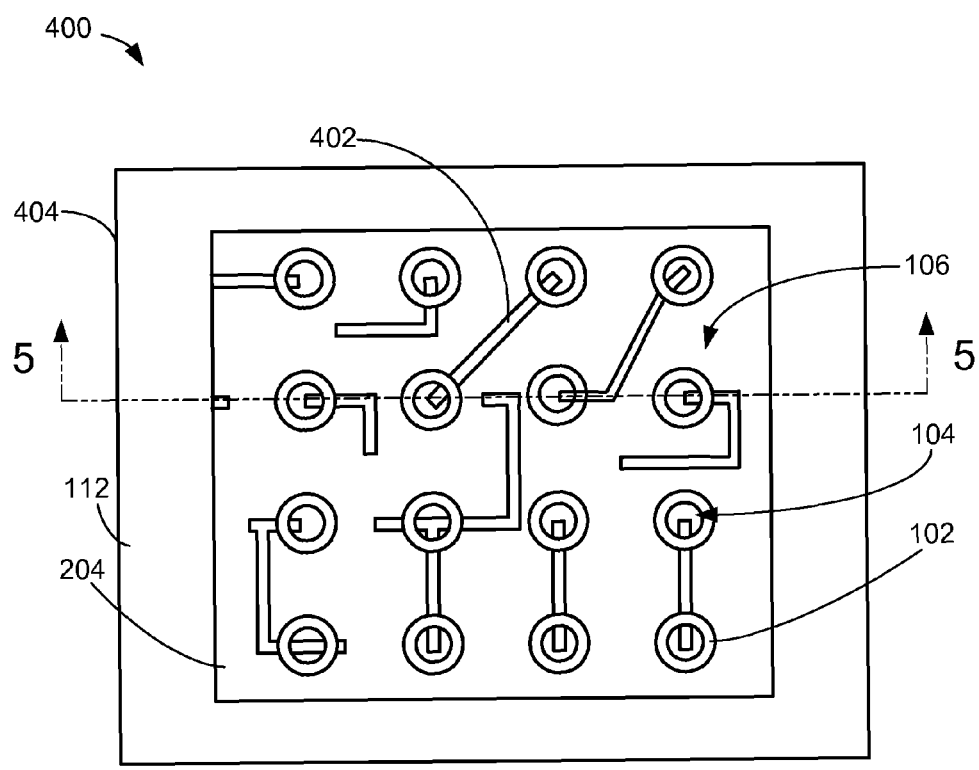
FIG. 4 is a top view similar to FIG. 1 of an integrated circuit package system in a second embodiment of the present invention in a build phase.

Referring now to FIG. 4, therein is shown a top view similar to FIG. 1 of an integrated circuit package system 400 in a second embodiment of the present invention in a build phase. The integrated circuit package system 400 can preferably include the bump ring 102, the inner cavity area 104, the outer bump area 106, trace conductors 402, a substrate 404, the substrate mask layer 112, and the prepreg layer 204.

The bump ring 102 can be distributed in a rectangular array configuration on the top side of the substrate 110 positioned over exposed portions of the trace conductors 402 on the substrate 404. The locations of the bump ring 102 are not limited in distribution arrangement and can have any configuration on the top side of the substrate 404 including a random distribution. The trace conductors 402 exposed on the prepreg layer 204 of the top side of the substrate 404 and located inside the substrate 404 provide connectivity between the substrate 404 and a next level component.

The trace conductors 402 can consists of copper wiring treated with tin, OSP, or other material having similar properties. The trace conductors 402 can be formed having non-restrictive layout orientations within a plane parallel to the top planar surface of the substrate 404.

The locations of the bump ring 102 are not limited in distribution arrangement and can have any configuration on the top side of the substrate 110 including a random distribution over exposed trace conductors 402. The bump ring 102 can preferably be formed having a ring shaped structure and can be composed of non-conductive material such as a solder mask or other material having similar properties.

The bump ring 102 forms the inner cavity area 104 and the outer bump area 106. The inner cavity area 104 can be used to provide structural support for connections established between the trace conductors 402 below the bump ring 102 and a next level component. The outer bump area 106 formed by the bump ring 102 is not covered with the substrate mask layer 112 and can consists of some of the trace conductors 402 substantially exposed adjacent the prepreg layer 204 on the top side of the substrate 404.

The substrate mask layer 112 can be applied on the top side of the substrate 110 covering the trace conductors 402 or the prepreg layer 204 from the perimeter of the outer bump area 106 formed by the bump ring 102 extending outward to each edge of the substrate 404.

The substrate mask layer 112 can be composed of a non-conductive material such as a solder mask or a material having similar properties.

Figure 5:
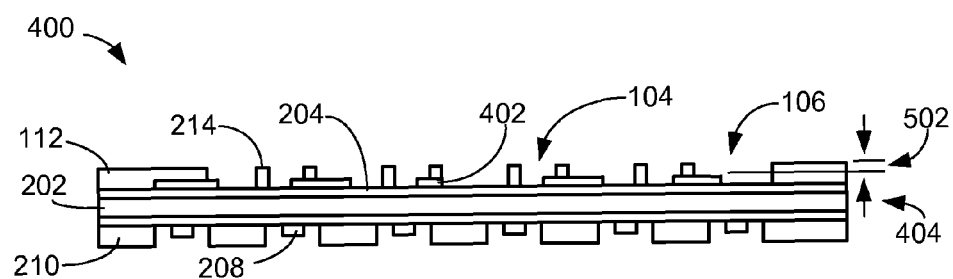
FIG. 5 is the cross-sectional view of FIG. 4 taken along the lines of 5-5.

Referring now to FIG. 5, therein is shown the cross-sectional view of FIG. 4 taken along the lines of 5-5. The substrate 404 consists of a substrate core 202 covered on both sides with the prepreg layer 204. The substrate core 202 provides connectivity between the trace conductors 402 within the inner cavity area 104 on the top side of the substrate 404 located below the bump ring edge 214 and the base contacts 208 exposed on the bottom side of the substrate 404.

The base mask layer 210 can be applied to the bottom side of the substrate 406 to separate the base contacts 208 from one another. Any of the trace conductors 402 or the prepreg layer 204 located and exposed outside a perimeter formed by the outer bump area 106 can be covered by the substrate mask layer 112. The substrate mask layer 112 can typically have a thickness of twenty micrometer resulting in an increase of at least ten micrometer in an additional gap height 502 due to the absence of the substrate mask layer 108 adjacent the outer bump area 106.

Figure 6:
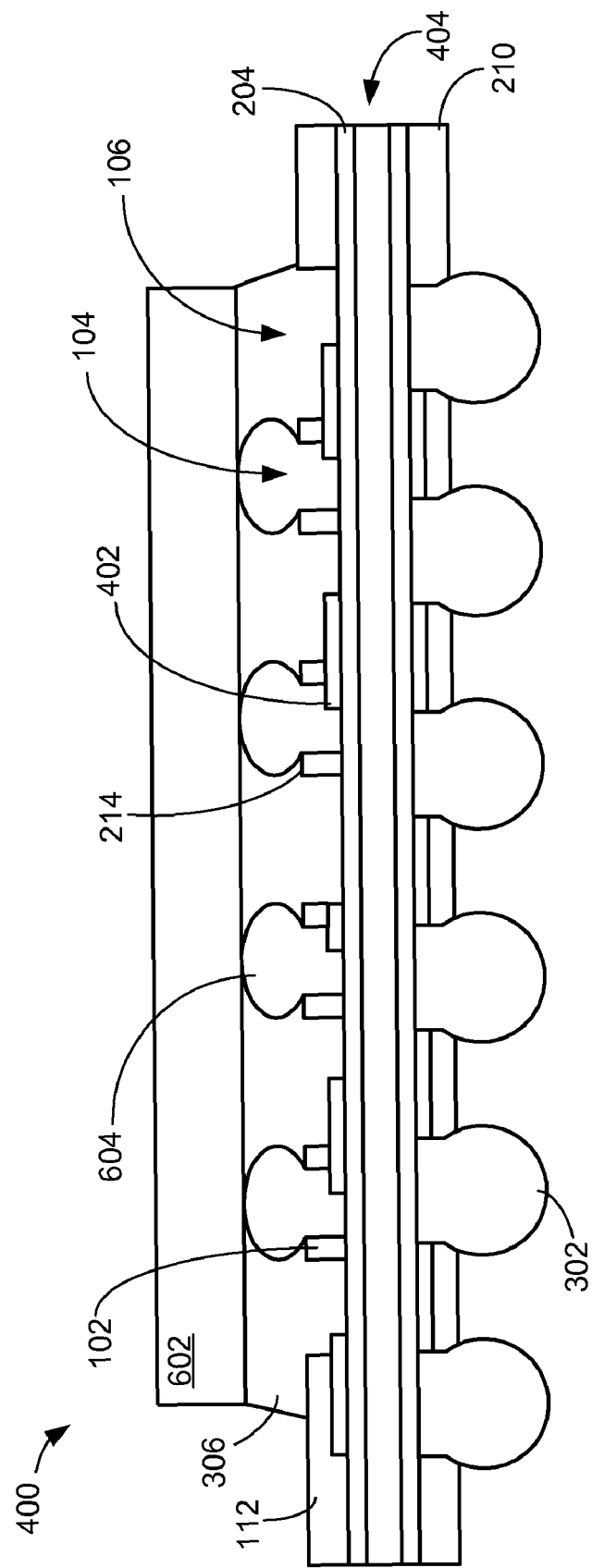
FIG. 6 is a cross-sectional of FIG. 5 of the integrated circuit package system of the present invention.

Referring now to FIG. 6, therein is shown a cross-sectional view of FIG. 5 of the integrated circuit package system 400 of the present invention. The integrated circuit package system 400 can preferably include a device 602 such as a flip chip, ball grid array chip, interposer, or modular unit having device interconnects 604. The device interconnects 604, such as solder bumps, can be used to connect the device 602 on to the portions of the trace conductors 402 within the inner cavity area 104 located below the bump ring edge 214 of the bump ring 102.

The device interconnects 604 of the device 602 provide connectivity between circuitry of the device 602 and the substrate 404. The system interconnects 302 can be attached to the base contacts 208 of FIG. 5 protruding above the prepreg layer 204 on the bottom side of the substrate 404 to provide connectivity between the substrate 404 and a next level system such as a printed circuit board.

The system interconnects 302 can be formed adjacent the base mask layer 210. The compound 306 can be applied below the device 602 to fill areas between the device 602 and the outer bump area 106 formed by the bump ring 102 on the top side of the substrate 404. The compound 306 substantially surrounds the device interconnects 604 and can also fill areas between the device 602 and portions of the substrate mask layer 112 on the top side of the substrate 404.

The compound 306 minimizes any thermal strain to the device interconnects 604 due to any differences between the coefficients of thermal expansion of the device 602 and of the substrate 404.

Figure 7:
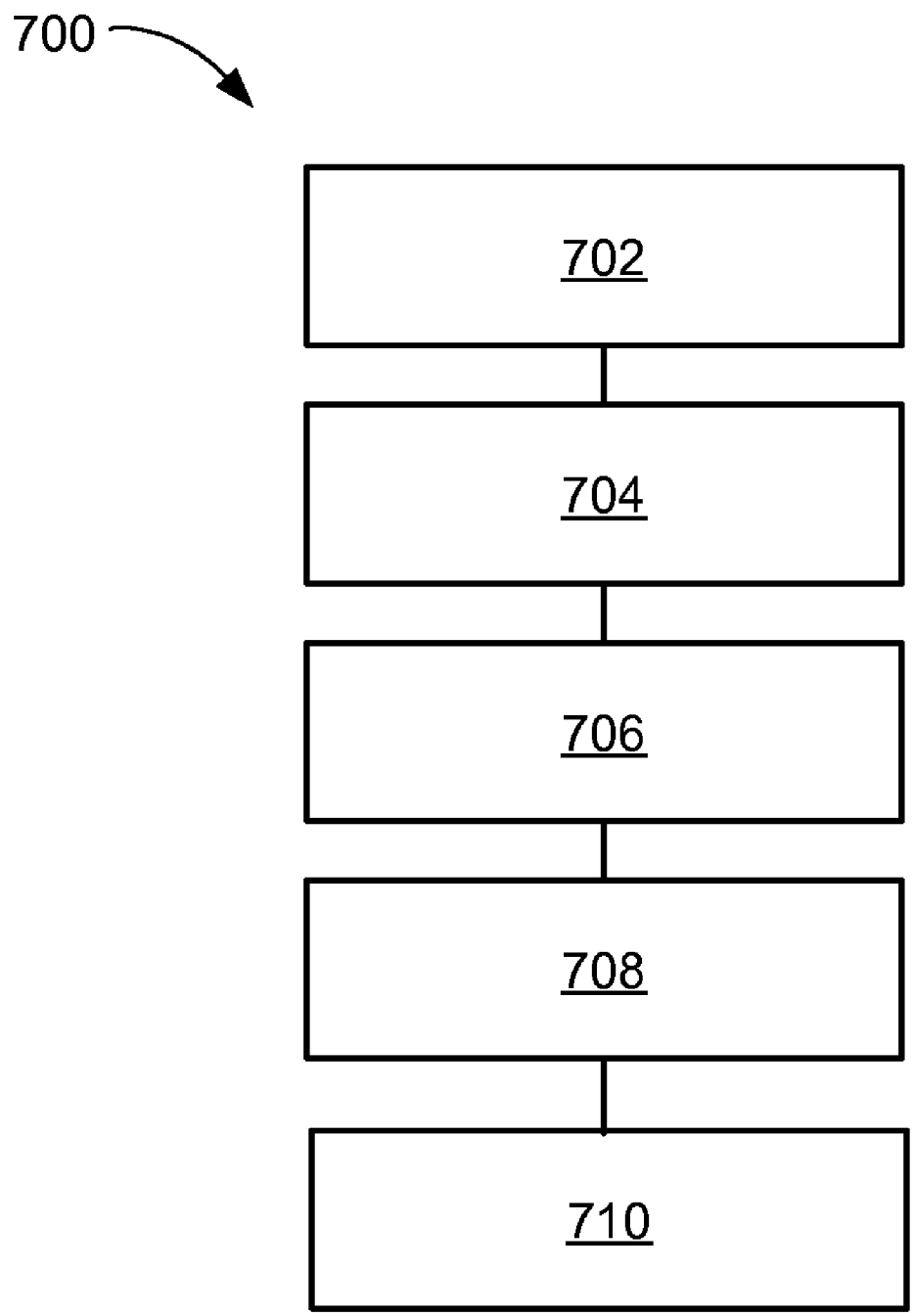
FIG. 7 therein is shown a flow chart of an integrated circuit package system for manufacturing the integrated circuit package system in an embodiment of the present invention.

Referring now to FIG. 7, therein is shown a flow chart of an integrated circuit package system 700 for manufacturing the integrated circuit package system 100 in an embodiment of the present invention. The system 700 includes providing a substrate having a top side with a trace conductor connected to a bottom side with a system interconnect in a block 702; forming a bump ring on the substrate, the bump ring having an inner cavity area over the trace conductor and an outer bump area in a block 704; applying a substrate mask layer adjacent a perimeter of the outer bump area in a block 706; connecting a device to the trace conductor below the bump ring in a block 708; and applying a compound between the device and the substrate in a block 710.

In greater detail, a system to provide the method and apparatus of the integrated circuit package system 100, in an embodiment of the present invention, is performed as follows:

1. Providing a substrate having a top side with a trace conductor connected to a bottom side with a system interconnect adjacent a base mask layer.

2. Forming a bump ring on the top side of the substrate, the bump ring having an inner cavity area over portions of the trace conductor and an outer bump area.

3. Applying a substrate mask layer adjacent a perimeter of the outer bump area over the trace conductor or a prepreg layer located outside the outer bump area on the top side of the substrate.

4. Connecting a device over the substrate to the trace conductor below the inner core area of the bump ring.

5. Applying a compound between the device and the outer bump area on the top side of the substrate.

Thus, it has been discovered that the integrated circuit package system method and apparatus of the present invention furnish important and heretofore unknown and unavailable solutions, capabilities, and functional aspects.

The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description.

Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
   providing a substrate having a top side with a trace conductor connected to a bottom side with a system interconnect;
   forming a bump ring, composed of non-conductive material, having an inner cavity area on the substrate with an outer bump area exposed and the trace conductor exposed through the inner cavity area;
   applying a substrate mask layer adjacent a perimeter of the outer bump area;
   connecting a device with a device interconnect in the inner cavity area surrounded by the non-conductive material of the bump ring; and
   applying a compound between the device and the substrate, the compound conformally encloses the bump ring.

2. The method as claimed in claim 1 further comprising attaching the device interconnect of the device to the trace conductor below the bump ring.

3. The method as claimed in claim 1 further comprising attaching the device interconnect connected to the trace conductor below the bump ring to the device.

4. The method as claimed in claim 1 wherein applying the compound consists of applying an underfill between the device and the substrate.

5. The method as claimed in claim 1 wherein providing a substrate having a top side with a trace conductor formed having non-restrictive layout orientations connected to a bottom side with a system interconnect.

6. A method for manufacturing an integrated circuit package system comprising:
   providing a substrate having a top side with a trace conductor connected to a bottom side with a system interconnect adjacent a base mask layer;
   forming a bump ring, composed of non-conductive material, having an inner cavity area on the top side of the substrate with an outer bump area exposed and portions of the trace conductor exposed through the inner cavity area;
   applying a substrate mask layer adjacent a perimeter of the outer bump area over the trace conductor or a prepreg layer located outside the outer bump area on the top side of the substrate;
   connecting a device with a device interconnect in the inner cavity area surrounded by the non-conductive material of the bump ring; and
   applying a compound between the device and the outer bump area on the top side of the substrate, the compound conformally encloses the bump ring.

7. The method as claimed in claim 6 further comprising attaching the device interconnect of the device to the trace conductor within the inner cavity area of the bump ring.

8. The method as claimed in claim 6 further comprising attaching the device interconnect connected to the trace conductor on to the device, the device interconnect is located within the inner cavity area of the bump ring.

9. The method as claimed in claim 6 wherein applying the compound consists of applying an underfill between the device and the substrate surrounding the outer bump area formed by the bump ring.

10. The method as claimed in claim 6 wherein providing a substrate having a top side with a trace conductor formed having non-restrictive layout orientations within a plane parallel to the top planar surface of the substrate connected to a bottom side with a system interconnect adjacent a base mask layer.

11. An integrated circuit package system comprising:
    a substrate having a top side with a trace conductor connected to a bottom side with a system interconnect;
    a bump ring of non-conductive material formed having an inner cavity area on the substrate with an outer bump and the trace conductor exposed through the inner cavity area;
    a substrate mask layer applied adjacent the perimeter of the outer bump area;
    a device over the substrate mask layer;
    a device interconnected in the inner cavity surrounded by the non-conductive material of the bump ring and connected to the device; and
    a compound applied between the device and the substrate, the compound conformally encloses the bump ring.

12. The system as claimed in claim 11 wherein the device interconnect of the device is attached to the trace conductor below the bump ring.

13. The system as claimed in claim 11 wherein the device interconnect is connected to the trace conductor below the bump ring attached to the device.

14. The system as claimed in claim 11 wherein the compound consists of an underfill applied between the device and the substrate.

15. The system as claimed in claim 11 wherein the trace conductor of the top side of the substrate is formed having non-restrictive layout orientations connected to the bottom side with a system interconnect.

16. The system as claimed in claim 11 wherein:
    the substrate having the top side with the trace conductor connected to the bottom side with the system interconnect formed adjacent a base mask layer;
    the bump ring formed having the outer bump area and the inner cavity area on the top side of the substrate, portions of the trace conductor exposed through the inner cavity area of the bump ring;

the substrate mask layer applied adjacent the perimeter of the outer bump area over the trace conductor or a prepreg layer located outside the outer bump area on the top side of the substrate;

the device connected over the substrate to the trace conductor below the inner core area of the bump ring; and the compound applied between the device and the outer bump area on the top side of the substrate.

17. The system as claimed in claim 16 wherein the device interconnect of the device is attached to the trace conductor within the inner cavity area of the bump ring.

18. The system as claimed in claim 16 wherein the device interconnect connected to the trace conductor is attached on to the device, the device interconnect is located within the inner cavity area of the bump ring.

19. The system as claimed in claim 16 wherein the compound consists of an underfill applied between the device and the substrate surrounding the outer bump area formed by the bump ring.

20. The system as claimed in claim 16 wherein trace conductor of the top side of the substrate is formed having non-restrictive layout orientations within a plane parallel to the top planar surface of the substrate connected to the bottom side with a system interconnect.

* * * * *

UNITED STATES PATENT AND TRADEMARK OFFICE
CERTIFICATE OF CORRECTION

| | | |
|---|---|---|
| PATENT NO. | : 8,143,096 B2 | Page 1 of 1 |
| APPLICATION NO. | : 12/194507 | |
| DATED | : March 27, 2012 | |
| INVENTOR(S) | : Park et al. | |

It is certified that error appears in the above-identified patent and that said Letters Patent is hereby corrected as shown below:

In the Claims

Column 8, claim 11, line 42, delete "a device interconnected in the inner cavity" and insert therefor --a device interconnect in the inner cavity--

Signed and Sealed this
Eighteenth Day of February, 2014

Michelle K. Lee
*Deputy Director of the United States Patent and Trademark Office*